(12) United States Patent
Avouris et al.

(10) Patent No.: US 8,455,297 B1
(45) Date of Patent: Jun. 4, 2013

(54) METHOD TO FABRICATE HIGH PERFORMANCE CARBON NANOTUBE TRANSISTOR INTEGRATED CIRCUITS BY THREE-DIMENSIONAL INTEGRATION TECHNOLOGY

(75) Inventors: Phaedon Avouris, Yorktown Heights, NY (US); Kuan-Neng Chen, Hsinchu (TW); Yu-Ming Lin, West Harrison, NY (US)

(73) Assignee: International Business Machines Corporation, Armonk, NY (US)

( * ) Notice: Subject to any disclaimer, the term of this patent is extended or adjusted under 35 U.S.C. 154(b) by 315 days.

(21) Appl. No.: 12/831,656

(22) Filed: Jul. 7, 2010

(51) Int. Cl.
*H01L 51/40* (2006.01)

(52) U.S. Cl.
USPC ............... 438/99; 438/455; 257/E21.087

(58) Field of Classification Search
USPC .................. 257/E21.087, E21.536
See application file for complete search history.

(56) References Cited

U.S. PATENT DOCUMENTS

| | | | |
|---|---|---|---|
| 5,640,049 | A | 6/1997 | Rostoker et al. |
| 5,756,395 | A | 5/1998 | Rostoker et al. |
| 6,740,910 | B2 | 5/2004 | Roesner et al. |
| 6,933,222 | B2 | 8/2005 | Dubin et al. |
| 7,332,810 | B2 | 2/2008 | Awano |
| 7,348,675 | B2 | 3/2008 | Dubin et al. |
| 2005/0156320 | A1 | 7/2005 | Mastromatteo |
| 2006/0255395 | A1 | 11/2006 | Fujita et al. |
| 2006/0290343 | A1* | 12/2006 | Crafts et al. ............ 324/158.1 |
| 2007/0102111 | A1 | 5/2007 | Monsma et al. |
| 2007/0166997 | A1 | 7/2007 | Knorr |
| 2007/0205450 | A1 | 9/2007 | Okita |
| 2007/0210883 | A1 | 9/2007 | Beer et al. |
| 2008/0111164 | A1 | 5/2008 | Awano |
| 2008/0119016 | A1 | 5/2008 | Dubin et al. |
| 2010/0144104 | A1 | 6/2010 | Okita |

FOREIGN PATENT DOCUMENTS

| | | |
|---|---|---|
| WO | WO2006007819 A1 | 1/2006 |
| WO | WO2007082854 A1 | 7/2007 |

OTHER PUBLICATIONS

Ploszl et al., "Wafer direct bonding tailoring adhesion between brittle materials," Materials Science and Engineering R: Reports, Elsevier Sequoia S.A., Lausanne, CH, vol. 25, No. 1-2, Mar. 10, 1999, pp. 1-88, XP004167445, ISSN: 0927-796X, DOI: 10.1016/S0927-796X(98)00017-5.

Chen et al., "Structure, Design and Process Control for Cu Bonded Interconnects in 3D Integrated Circuits," IEDM (2006).

Chen et al., "Improved Manufacturability of Cu Bond Pads and Implementation of Seal Design in 3D integrated Circuits and Packages," VMIC (2006).

Meric et al., "Hybrid Carbon Nanotube-Silicon Complementary Metal Oxide Semiconductor Circuits," J. Vac. Sci. Technol. B 25(6) p. 2577-2580 (Nov./Dec. 2007).

(Continued)

*Primary Examiner* — Cheung Lee
(74) *Attorney, Agent, or Firm* — Vazken Alexanian; Michael J. Chang, LLC

(57) ABSTRACT

Techniques for fabricating carbon nanotube-based devices are provided. In one aspect, a method for fabricating a carbon nanotube-based integrated circuit is provided. The method comprises the following steps. A first wafer comprising carbon nanotubes is provided. A second wafer comprising one or more device elements is provided. One or more of the carbon nanotubes are connected with one or more of the device elements by bonding the first wafer and the second wafer together. A carbon nanotube-based integrated circuit is also provided.

23 Claims, 6 Drawing Sheets

OTHER PUBLICATIONS

Tsai et al., "Selective Carbon Nanotube Growth on Silicon Tips With the Soft Electrostatic Force Bonding and Catalyst Transfer concepts," Nanotechnology 16, S296-S299 (2005).

Cao et al., "Medium-Scale Carbon Nanotube Thin-Film Integrated Circuits on Flexible Plastic Substrates," Nature, vol. 454, (Jul. 2008).

Close et al., "A 1 GHz Integrated Circuit with Carbon Nanotube Interconnects and Silicon Transistors," Nano Letters, vol. 8, No. 2, 706-709 (2008).

Zhou et al., "A Method of Printing Carbon Nanotube Thin Films," Applied Physics Letters 88, 123109 (2006).

* cited by examiner

METHOD TO FABRICATE HIGH PERFORMANCE CARBON NANOTUBE TRANSISTOR INTEGRATED CIRCUITS BY THREE-DIMENSIONAL INTEGRATION TECHNOLOGY

FIELD OF THE INVENTION

The present invention relates to carbon nanotube technology and more particularly, to techniques for fabricating carbon nanotube-based devices.

BACKGROUND OF THE INVENTION

Carbon nanotubes possess extraordinary electronic properties that are attractive for high-speed and high-performance circuits. One of the major challenges in utilizing devices and complex circuits involving carbon nanotubes lies in the incompatibility of the carbon nanotube growth conditions and the process limitation of current complementary metal-oxide-semiconductor (CMOS) technology. For example, chemical vapor deposition (CVD) grown carbon nanotubes require a growth condition of at least 600° C. for producing high quality nanotubes, which exceeds the temperature capacity of about 350° C. to about 400° C. for CMOS processes.

One possible solution to work around this temperature limitation is to deposit pre-formed carbon nanotubes on the substrate from a solution. However, during the subsequent processing, the deposited carbon nanotubes may be destroyed via oxidation and the properties of the carbon nanotubes may also be altered due to surface treatments.

Another practical challenge of realizing integrated circuits based on carbon nanotubes is the alignment of carbon nanotubes with the rest of the circuit components. While there has been much progress in controlling the growth orientation and/or the deposition location of nanotubes, their alignment with the rest of the circuits has not been addressed.

Therefore, techniques for three-dimensional carbon nanotube-based integrated circuit device integration would be desirable.

SUMMARY OF THE INVENTION

The present invention provides techniques for fabricating carbon nanotube-based devices. In one aspect of the invention, a method for fabricating a carbon nanotube-based integrated circuit is provided. The method comprises the following steps. A first wafer comprising carbon nanotubes is provided. A second wafer comprising one or more device elements is provided. One or more of the carbon nanotubes are connected with one or more of the device elements by bonding the first wafer and the second wafer together.

The carbon nanotubes can be deposited on a first substrate. A first oxide layer can be deposited onto the substrate covering the carbon nanotubes. One or more first electrodes can be formed that extend at least part way through the first oxide layer and are in contact with one or more of the carbon nanotubes. One or more device elements can be fabricated on a second substrate. A second oxide layer can be deposited over the device elements. One or more second electrodes can be formed that extend at least part way through the second oxide layer connected to one or more of the device elements.

In another aspect of the invention, a carbon nanotube-based integrated circuit is provided. The carbon nanotube-based integrated circuit includes a first wafer comprising carbon nanotubes; and a second wafer comprising one or more device elements, wherein the first wafer is bonded to the second wafer such that one or more of the carbon nanotubes are connected with one or more of the device elements.

A more complete understanding of the present invention, as well as further features and advantages of the present invention, will be obtained by reference to the following detailed description and drawings.

DETAILED DESCRIPTION OF PREFERRED EMBODIMENTS

In order to successfully use carbon nanotubes as active elements in a practical device and/or circuit, a new fabrication scheme is required to combine existing complementary metal-oxide-semiconductor (CMOS) technology and the carbon nanotubes. The present teachings provide such a fabrication scheme.

FIGS. 1-15 are diagrams illustrating an exemplary methodology for fabricating a carbon nanotube-based integrated circuit. In this particular example, carbon nanotube-based transistors are formed by providing carbon nanotubes fabricated on one substrate (referred to herein as a carbon nanotube wafer) and CMOS device elements (and associated wiring) on another substrate (referred to herein as a device wafer), then connecting the carbon nanotubes with one or more of the device elements through the use of face-to-face bonding to bond the carbon nanotube wafer and the device wafer together in a three-dimensional configuration.

Three-dimensional integration has become a very promising candidate to fulfill packaging and integrated circuit (IC) technology gaps for carbon nanotube-based electronics. The ability to stack CMOS state-of-the-art active device layers has been demonstrated. Three-dimensional integration technology can increase system performance even in the absence of scaling. Specifically, three-dimensional integration offers decreased total wiring length (and thus reduced interconnect delay times), a dramatically increased number of interconnects between chips and the ability to allow dissimilar materials, process technologies and functions to be successfully integrated. In addition, it has been noted that in carbon nanotube-based circuits, system performance is drastically affected by the parasitic capacitance and the resistance of interconnects.

Figure 1:
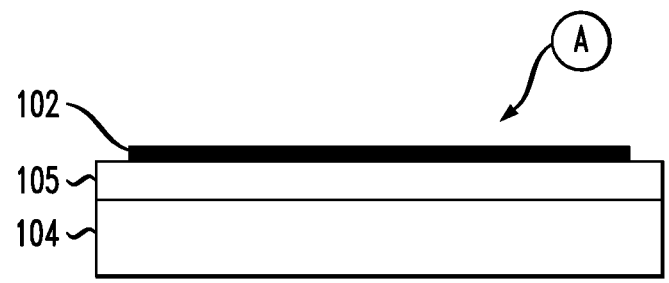
FIG. 1 is a cross-sectional diagram illustrating a carbon nanotube wafer with carbon nanotubes having been deposited onto an oxide covered substrate according to an embodiment of the present invention.

As shown in FIG. 1, a cross-sectional view, the carbon nanotube wafer can be formed by first depositing carbon nanotubes 102 onto an oxide covered substrate. According to an exemplary embodiment, the oxide covered substrate includes a silicon (Si) substrate 104 covered with an oxide 105. In this example, carbon nanotubes 102 are deposited onto oxide 105. These carbon nanotubes can be grown using a chemical vapor deposition (CVD) process or deposited from a solution. These CVD and solution deposition processes are well-known in the art. According to an exemplary embodiment wherein the CVD process is employed, metal catalysts (e.g., molybdenum (Mo), iron (Fe), nickel (Ni)) are first deposited on the oxide covered substrate, followed by flowing high-temperature (e.g., between about 450 degrees Celsius (° C.) to about 900° C.) carbon-containing gas, such as ethanol or methane, over the substrate surface to form the carbon nanotubes.

For applications where carbon nanotubes are used as active components in the circuit, such as transistor channels, semiconducting nanotubes are needed. In practice, a mixture of semiconducting and metallic carbon nanotubes is generally attained. In this instance, carbon nanotube films with a high purity (greater than 99 percent (%)) of semiconducting nanotubes deposited from purified nanotube solutions are used. The term purity as used herein refers to a ratio between semiconducting and metallic carbon nanotubes. Methods to separate metallic from semiconducting carbon nanotubes in a solution are well-known to those of skill in the art. In one example, the buoyant density difference between metallic and semiconducting nanotubes in aqueous solutions after functionalizing with proper surfactants, such as sodium cholate, could be utilized to separate the two type of nanotubes with ultracentrifugation. Solutions containing high purity (greater than 99.9%) of semiconducting carbon nanotubes can be prepared by this approach.

Figure 2:
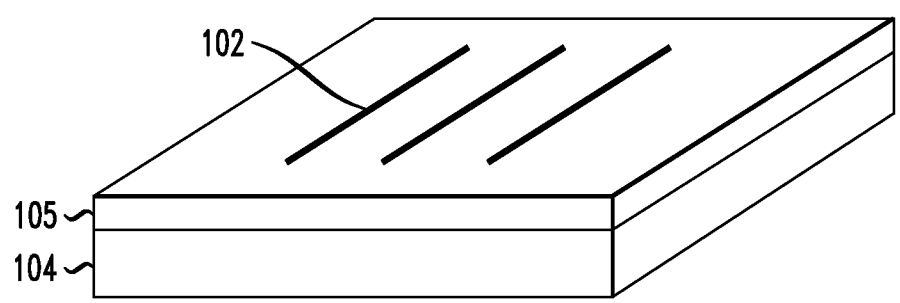
FIG. 2 is a diagram illustrating a top-down view of the carbon nanotube wafer of FIG. 1 according to an embodiment of the present invention.

A top view (from vantage point A) of the carbon nanotube wafer is shown in FIG. 2. As shown in FIG. 2, carbon nanotubes 102 are aligned along a top surface of oxide 105 (of the oxide covered substrate). However, it is not necessary for all nanotubes to be aligned. They are drawn in parallel in FIG. 2 only for the sake of clarity.

Figure 3:
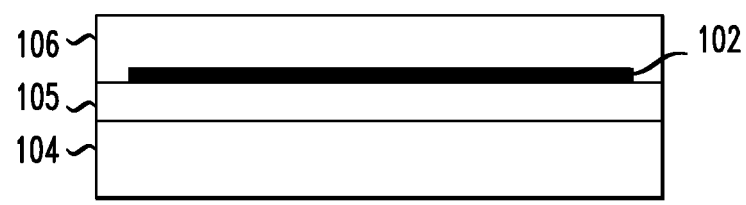
FIG. 3 is a cross-sectional diagram of the carbon nanotube wafer illustrating an oxide layer having been deposited onto the oxide covered substrate covering the carbon nanotubes according to an embodiment of the present invention.

As shown in FIG. 3, a cross-sectional diagram, oxide layer 106 is then deposited onto the oxide covered substrate covering carbon nanotubes 102. This oxide layer will serve two purposes. First, oxide layer 106 will serve as a gate dielectric for the carbon nanotubes. Second, oxide layer 106 will be used later in the fabrication process to protect the carbon nanotubes from damage by subsequent processing. Oxide layer 106 can be deposited using atomic layer deposition (ALD) or by a low-temperature (less than 300° C.) CVD, or by a combination of the two deposition processes. A low-temperature oxide CVD process is preferred over high-temperature CVD processes to minimize potential adverse effects on the nanotube quality.

Figure 4:
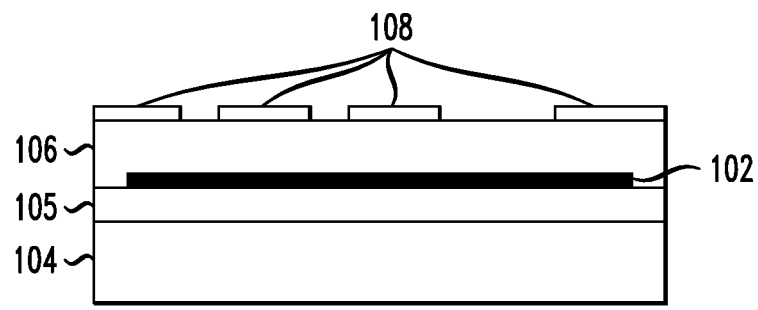
FIG. 4 is a cross-sectional diagram of the carbon nanotube wafer illustrating a mask layer having been deposited over the oxide layer and patterned according to an embodiment of the present invention.

As shown in FIG. 4, a cross-sectional diagram, a mask layer 108 is deposited over oxide layer 106. Mask layer 108 can comprise a photoresist material, such as poly(methyl methacrylate) (PMMA) (i.e., an electron beam (e-beam) resist), or a hard mask (metal) material. Mask layer 108 is then patterned with a footprint and location of a number of vias that will be used to define source and drain electrodes of the carbon nanotube-based transistors (see below). Processes for depositing and patterning a mask layer are known to those of skill in the art and thus are not described further herein.

Figure 5:
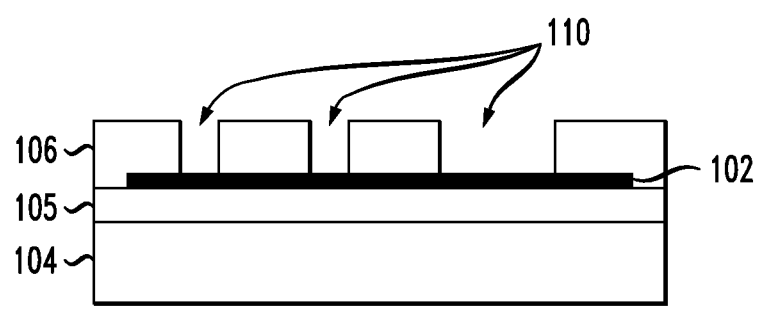
FIG. 5 is a cross-sectional diagram of the carbon nanotube wafer illustrating the oxide layer having been etched through the patterned mask layer forming vias that expose regions of the carbon nanotubes to receive metal electrodes according to an embodiment of the present invention.

As shown in FIG. 5, a cross-sectional diagram, oxide layer 106 is etched, using a wet etch process through patterned mask layer 108, forming vias 110 that expose regions of carbon nanotubes 102 to receive metal electrodes (see below). After the wet etch is completed, patterned mask layer 108 is removed, for example, using acetone.

Figure 6:
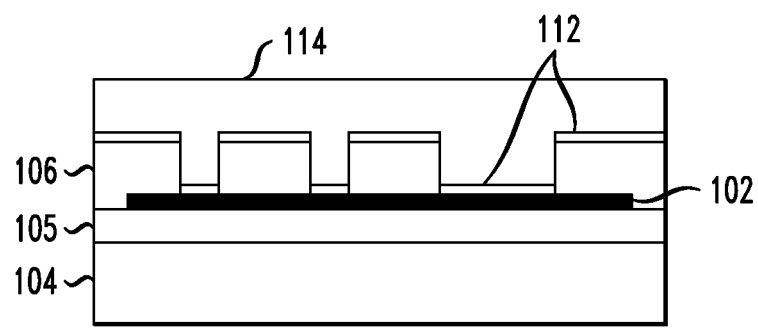
FIG. 6 is a cross-sectional diagram of the carbon nanotube wafer illustrating metal having been deposited over the oxide layer and filling the vias according to an embodiment of the present invention.

As shown in FIG. 6, a cross-sectional diagram, metal is deposited over oxide layer 106, filling vias 110. According to an exemplary embodiment, the metal is made up of two layers. The layer which is deposited first, i.e., metal layer 112, is a thin metal layer used to enable good contact with the carbon nanotubes and comprises a metal such as palladium (Pd). Metal layer 112 has a thickness of from about 1 nanometer (nm) to about 100 nm and as shown in FIG. 6 lines a top surface of oxide layer 106/the exposed regions of carbon nanotubes 102. The second layer, i.e., metal layer 114, deposited over metal layer 112 is used to permit adhesion in a wafer bonding step (see below) and comprises copper (Cu). Metal layer 114 is deposited over metal layer 112 and fills vias 110. As shown in FIG. 6, metal layer 114 can extend above the surface of oxide layer 106. Metal layer 114 has a thickness of from about 5 nm to about 300 micrometers (μm). By way of example only, metal layer 112 can be formed by thermal evaporation, while the metal layer 114 can be formed by electrochemical deposition so as to form a thicker metal film.

Figure 7:
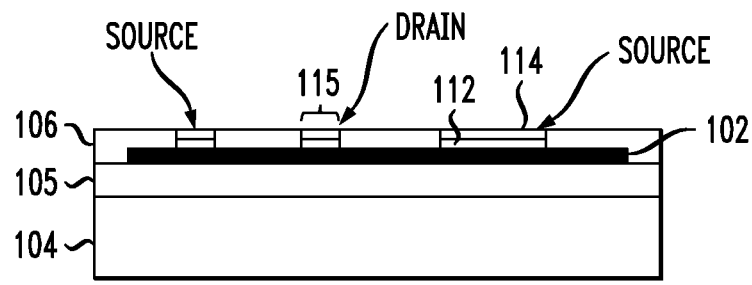
FIG. 7 is a cross-sectional diagram of the carbon nanotube wafer illustrating the metal having been polished down to a desired thickness according to an embodiment of the present invention.

As shown in FIG. 7, a cross-sectional diagram, metal layers 112 and 114 are then polished (e.g., using chemical mechanical polishing (CMP)) to thin metal layer 114 down to a desired thickness. This polishing process will also remove any excess metal from metal layer 112 and can further thin oxide layer 106. According to an exemplary embodiment, oxide layer 106, after thinning, has a thickness of from about 5 nm to about 1 μm. The amount of oxide layer 106 that is removed is controlled by the duration of the CMP process. At this step in the process distinct transistor contact regions 115 are defined. Exemplary source and drain electrode regions are shown labeled in FIG. 7. The result is a completed carbon nanotube wafer which will be bonded using face-to-face bonding to a device wafer (see below).

Figure 8:
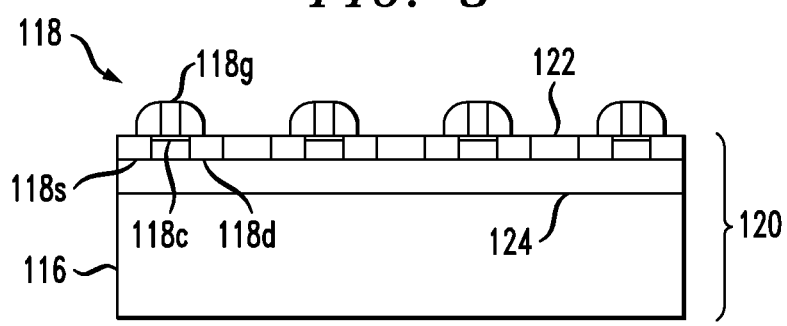
FIG. 8 is a cross-sectional diagram illustrating a device wafer with one or more device elements fabricated on a silicon-on-insulator (SOI) substrate according to an embodiment of the present invention.
Figure 9:
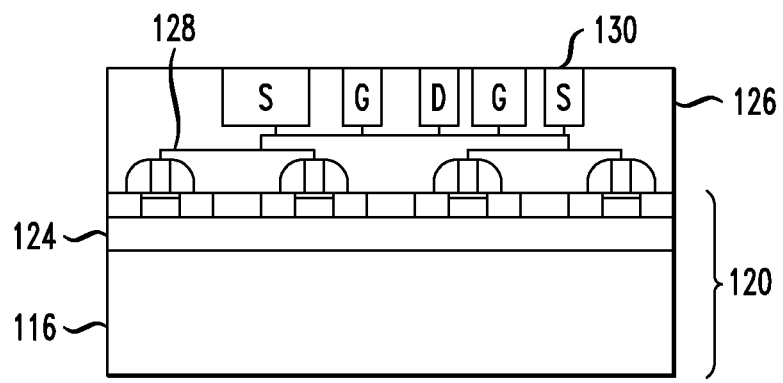
FIG. 9 is a cross-sectional diagram of the device wafer illustrating an oxide layer having been deposited over the device elements, one or more metal layers having been formed in the oxide layer in contact with device elements and one or more electrodes having been formed in the oxide layer in contact with the metal layers according to an embodiment of the present invention.

The device wafer is then provided. As shown in FIG. 8, a cross-sectional diagram, the device wafer can be formed by first fabricating one or more device elements 118 on a, i.e., silicon-on-insulator (SOI) substrate 120 having a SOI layer 122 over a buried oxide (BOX) 124 and Si layer 116. According to an exemplary embodiment, each device element comprises a source region 118s connected to a drain region 118d by a channel 118c, and a gate region 118g over the channel. According to an exemplary embodiment, device elements 118 comprise silicon-based CMOS device components, such as memory and/or logic transistors. Techniques for fabricating such device elements in an SOI substrate are known to those of skill in the art and thus are not described further herein. As shown in FIG. 9, a cross-sectional diagram, an oxide layer 126 is deposited over device elements 118. Oxide layer 126 will serve as a bonding oxide layer during the wafer bonding step detailed below. One or more metal layers 128 are then formed in oxide layer 126 in contact with device elements 118.

Next, one or more electrodes 130 are formed in oxide layer 126 in contact with metal layers 128 (metal layers 128 connect device elements 118 with electrodes 130). Electrodes 130 form source/drain/gate electrodes to device elements 118 and comprise Cu. An exemplary configuration of source (S)/drain (D)/gate (G) electrodes is shown labeled in FIG. 9.

Figure 10:
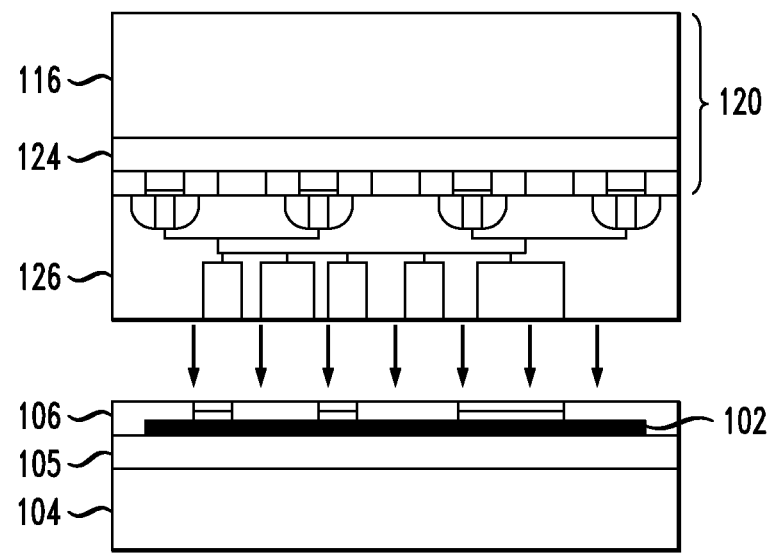
FIG. 10 is a cross-sectional diagram illustrating the device wafer having been flipped for face-to-face bonding with the carbon nanotube wafer according to an embodiment of the present invention.
Figure 11:
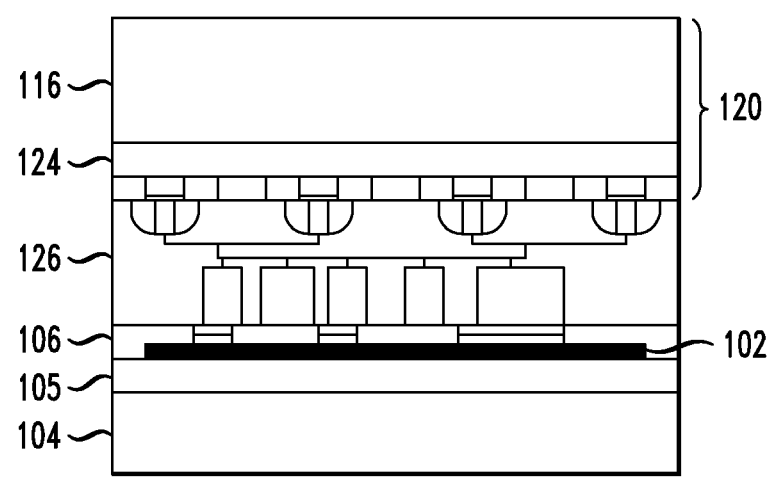
FIG. 11 is a cross-sectional diagram illustrating a resulting device layout after the device wafer and the carbon nanotube wafer have been bonded together according to an embodiment of the present invention.

As shown in FIG. 10, a cross-sectional diagram, the device wafer is flipped for face-to-face bonding with the carbon nanotube wafer (i.e., the wafers are aligned to permit a top surface or "face" of each wafer to bond with a corresponding top surface or "face" of the other wafer). While in this example the device layer is flipped, the same processes can be carried out by flipping the carbon nanotube wafer instead. The resulting device layout after the two wafers are bonded together is shown in FIG. 11, a cross-sectional diagram. The bonding approach here is based on Cu-to-Cu (between contact regions 115 of the carbon nanotube wafer and source/drain/gate electrodes 130 of the device wafer) and oxide-to-oxide bonding (between oxide layer 106 of the carbon nanotube wafer and oxide layer 126 of the device wafer) simultaneously. The bonding temperature employed is below 400° C. so as not to destroy components in the device layer during the bonding process. Cu-to-Cu bonding and oxide-to-oxide bonding processes are known to those of skill in the art and thus are not described further herein.

Figure 12:
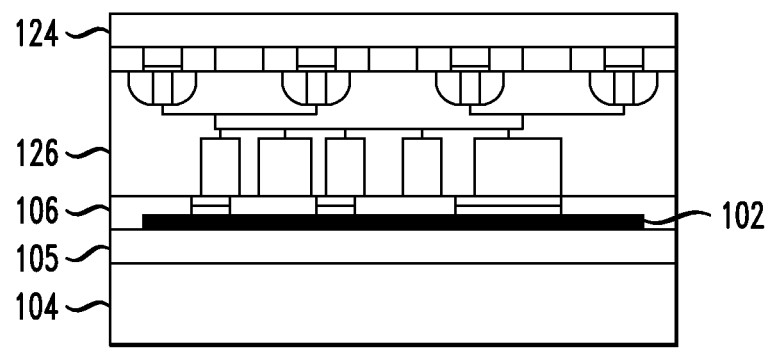
FIG. 12 is a cross-sectional diagram illustrating a majority of the substrate having been removed from the device wafer according to an embodiment of the present invention.

After the two wafers are bonded together, the next step is the substrate removal process. Since now there are two substrates from two wafers after the bonding, the choice of which substrate to remove relies on the design of circuits (i.e., to permit the fabrication of additional layers of the structure). In FIG. 12, a cross-sectional diagram, substrate 120 is thinned (i.e., Si layer 116 is removed from the device wafer). According to an exemplary embodiment, the desired substrate is removed using CMP or other similar polishing and/or grinding process. As highlighted above, substrate 120 is an SOI substrate, and as such BOX 124 is the stopping layer for the CMP process.

Figure 13:
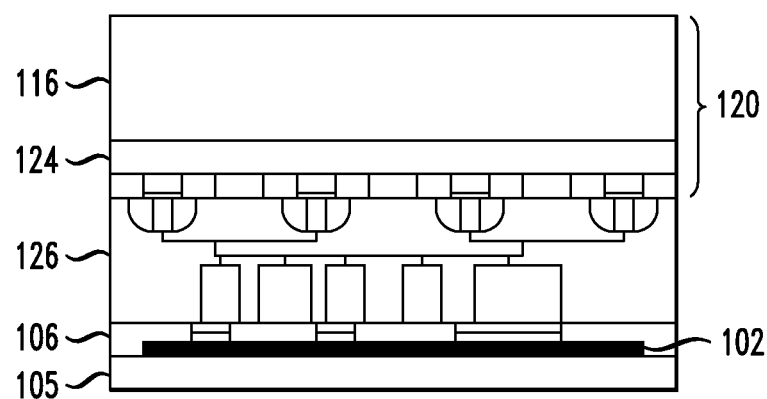
FIG. 13 is a cross-sectional diagram illustrating the substrate having been removed from the carbon nanotube wafer according to an embodiment of the present invention.

In FIG. 13, a cross-sectional diagram, substrate 104 is removed from the carbon nanotube wafer, leaving oxide 105.

As highlighted above, the carbon nanotube wafer is based on an oxide covered Si substrate. The oxide can act as a stopping layer during the substrate removal. This type of selective etch can be achieved by using an etching process which removes silicon but not oxide.

Figure 14:
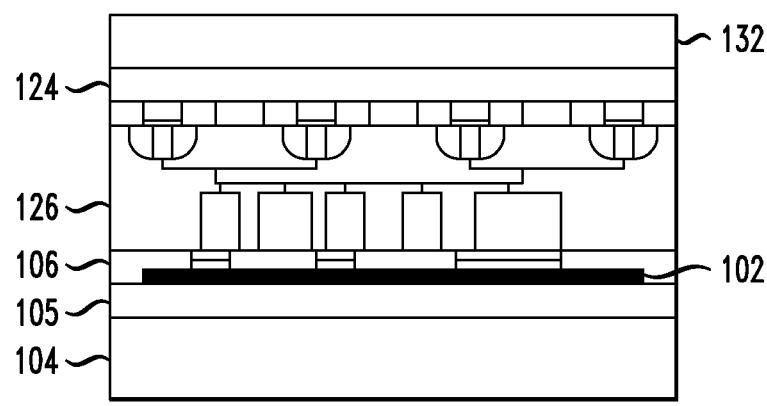
FIG. 14 is a cross-sectional diagram illustrating additional device layers/metal layers having been formed adjacent to the device wafer according to an embodiment of the present invention.
Figure 15:
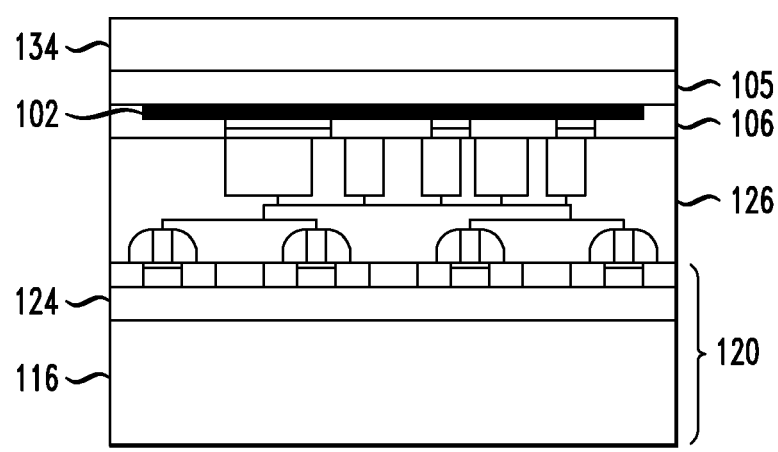
FIG. 15 is a cross-sectional diagram illustrating additional device layers/metal layers having been formed adjacent to the carbon nanotube wafer according to an embodiment of the present invention.

An additional device layer(s) or a next metal layer Mn can be fabricated on the bonded wafer structure. The surface on which the fabrication takes place can depend on which substrate was removed above. Specifically, if substrate 120 has been removed (see FIG. 12 described above), then additional device layers/metal layers, represented schematically by layer 132, are formed adjacent to BOX 124. This configuration is shown in FIG. 14, a cross-sectional diagram. On the other hand, if substrate 104 has been removed (see FIG. 13 described above), then additional device layers/metal layers, represented schematically by layer 134, are formed adjacent to oxide layer 105. This configuration is shown in FIG. 15, a cross-sectional diagram. It is notable that in the configuration shown in FIG. 15, the bonded wafer structure has been flipped to permit top-down fabrication of the additional device layers/metal layers.

In conclusion, the present techniques offer a successful and easily-implemented solution to three-dimensional carbon nanotube-based IC device integration. Advantages of the present techniques include, but are not limited to, (1) carbon nanotubes can be prepared by a wide range of different approaches, including but not limited to CVD grown nanotubes, nanotubes from solution deposition, nanotube thin films, (2) complex circuits can be pre-fabricated in standard clean-room facilities without the potential contamination from carbon nanotubes and metal catalysts, (3) the alignment in the wafer bonding process ensures the nanotubes are always incorporated at the desirable positions of the circuit, (4) the requirements of existing CMOS devices, such as temperature, wet etching environment, gas ambient during process, still can be kept since nanotubes are fabricated separately on another wafer and (5) the circuit delay time, which is dominated by interconnects in the case of carbon nanotube circuits, can be significantly reduced.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for fabricating a carbon nanotube-based integrated circuit, comprising the steps of:
    providing a first wafer comprising carbon nanotubes which is formed by depositing the carbon nanotubes on a first substrate, depositing a first oxide layer onto the substrate covering the carbon nanotubes, and forming one or more first electrodes that extend at least part way through the first oxide layer and are in contact with one or more of the carbon nanotubes;
    providing a second wafer comprising one or more device elements which is formed by fabricating the device elements on a second substrate, depositing a second oxide layer over the device elements, and forming one or more second electrodes that extend at least part way through the second oxide layer connected to one or more of the device elements; and
    connecting one or more of the carbon nanotubes with one or more of the device elements by bonding the first wafer and the second wafer together.

2. The method of claim 1, further comprising the step of:
forming one or more metal layers in the second oxide layer in contact with the device elements.

3. The method of claim 1, wherein both the first electrodes and the second electrodes comprise copper and wherein the step of connecting the carbon nanotubes with the device elements further comprises the steps of:
forming an oxide-to-oxide bond between the first oxide layer and the second oxide layer; and
forming a copper-to-copper bond between the first electrodes and the second electrodes.

4. The method of claim 1, wherein the first substrate comprises an oxide covered substrate.

5. The method of claim 1, wherein the second substrate comprises a silicon-on-insulator substrate.

6. The method of claim 1, wherein the carbon nanotubes are deposited on the first substrate using chemical vapor deposition.

7. The method of claim 1, wherein the carbon nanotubes are deposited on the first substrate from a solution.

8. The method of claim 1, wherein the carbon nanotubes comprise a mixture of semiconducting and metallic carbon nanotubes and wherein the mixture contains greater than 99 percent semiconducting carbon nanotubes.

9. The method of claim 1, further comprising the steps of;
forming vias through the first oxide layer that expose regions of the carbon nanotubes;
depositing a first metal layer that lines the exposed regions of the carbon nanotubes; and
depositing a second metal layer over the first metal layer and filling the vias.

10. The method of claim 9, wherein the step of forming the vias through the first oxide layer further comprises the steps of:
depositing a mask layer over the first oxide layer;
patterning the mask layer with a footprint and location of each of the vias;
etching the first oxide layer through the patterned mask layer to form the vias; and
removing the mask layer.

11. The method of claim 10, wherein the step of etching the first oxide layer through the patterned mask layer to form the vias is performed using a wet etch process.

12. The method of claim 9, wherein the first metal layer comprises palladium.

13. The method of claim 9, wherein the first metal layer has a thickness of from about 1 nanometer to about 100 nanometers.

14. The method of claim 9, wherein the second metal layer comprises copper.

15. The method of claim 9, further comprising the steps of:
thinning the second metal layer.

16. The method of claim 15, wherein the second metal layer is thinned using chemical mechanical polishing.

17. The method of claim 1, further comprising the step of:
flipping one of the first wafer or the second wafer to permit face-to-face bonding between the first wafer and the second wafer.

18. The method of claim 1, further comprising the step of:
thinning one of the first substrate or the second substrate.

19. A carbon nanotube-based integrated circuit, comprising:
a first wafer comprising carbon nanotubes having a first substrate on which the carbon nanotubes are disposed, a first oxide layer covering the carbon nanotubes, and one or more first electrodes that extend at least part way through the first oxide layer and are in contact with one or more of the carbon nanotubes; and
a second wafer comprising one or more device elements having a second substrate on which the device elements are fabricated, a second oxide layer over the device elements, and one or more second electrodes that extend at least part way through the second oxide layer connected to one or more of the device elements, wherein the first wafer is bonded to the second wafer such that one or more of the carbon nanotubes are connected with one or more of the device elements.

20. The carbon nanotube-based integrated circuit of claim 19, wherein the second wafer further comprises:
one or more metal layers in the second oxide layer in contact with the device elements.

21. The carbon nanotube-based integrated circuit of claim 19, wherein both the first electrodes and the second electrodes comprise copper and wherein the carbon nanotubes are connected with one or more of the device elements by way of an oxide-to-oxide bond between the first oxide layer and the second oxide layer, and a copper-to-copper bond between the first electrodes and the second electrodes.

22. The carbon nanotube-based integrated circuit of claim 19, wherein the first substrate comprises an oxide covered substrate.

23. The carbon nanotube-based integrated circuit of claim 19, wherein the second substrate comprises a silicon-on-insulator substrate.

* * * * *